(12) United States Patent
Liaw

(10) Patent No.: US 9,041,117 B2
(45) Date of Patent: May 26, 2015

(54) SRAM CELL CONNECTION STRUCTURE

(71) Applicant: Taiwan Semiconductor Manufacturing Company, Ltd., Hsin-Chu (TW)

(72) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 51 days.

(21) Appl. No.: 13/675,679

(22) Filed: Nov. 13, 2012

(65) Prior Publication Data

US 2014/0035056 A1 Feb. 6, 2014

Related U.S. Application Data

(60) Provisional application No. 61/677,942, filed on Jul. 31, 2012.

(51) Int. Cl.
| | |
|---|---|
| *H01L 21/8244* | (2006.01) |
| *G11C 11/412* | (2006.01) |
| *H01L 27/02* | (2006.01) |
| *H01L 27/11* | (2006.01) |

(52) U.S. Cl.
CPC .......... *G11C 11/412* (2013.01); *H01L 27/0207* (2013.01); *H01L 27/1104* (2013.01)

(58) Field of Classification Search
CPC ................ H01L 2924/137; H01L 2924/1434; H01L 2024/1435; H01L 21/8238; H01L 27/11807; H01L 21/788; H01L 23/535
USPC .......... 257/E27.096, E21.661, 225, E27.102, 257/E21.662, 390, E27.084, E21.613, 257/E21.645, 269, 393, 499, 512, 734, 774, 257/776; 365/156, 51, 63, 67, 68, 72
See application file for complete search history.

(56) References Cited

U.S. PATENT DOCUMENTS

| | | | |
|---|---|---|---|
| 5,488,248 A | 1/1996 | Lee et al. | |
| 2005/0141265 A1* | 6/2005 | Yokoyama | 365/154 |
| 2005/0167700 A1 | 8/2005 | Abbott | |
| 2006/0131614 A1* | 6/2006 | Liaw | 257/222 |
| 2009/0152641 A1* | 6/2009 | Ohkawa | 257/369 |
| 2009/0173971 A1* | 7/2009 | Houston et al. | 257/204 |
| 2013/0107608 A1* | 5/2013 | Mann et al. | 365/154 |

FOREIGN PATENT DOCUMENTS

| | | |
|---|---|---|
| JP | 2000183178 | 6/2000 |
| KR | 19930014994 | 7/1993 |

* cited by examiner

*Primary Examiner* — Galina Yushina
(74) *Attorney, Agent, or Firm* — Slater & Matsil, L.L.P.

(57) ABSTRACT

A Static Random Access Memory (SRAM) cell includes a first pull-up transistor and a second pull-up transistor, and a first pull-down transistor and a second pull-down transistor forming cross-latched inverters with the first pull-up transistor and the second pull-up transistor. A conductive feature includes a first leg having a first longitudinal direction, wherein the first leg interconnects a drain of the first pull-up transistor and a drain of the first pull-down transistor. The conductive feature further includes a second leg having a second extending direction. The first longitudinal direction and the second extending direction are un-perpendicular and un-parallel to each other. The second leg interconnects the drain of the first pull-up transistor and a gate of the second pull-up transistor.

18 Claims, 9 Drawing Sheets

SRAM CELL CONNECTION STRUCTURE

This application claims the benefit of the following provisionally filed U.S. Patent application: Application Ser. No. 61/677,942, filed Jul. 31, 2012, and entitled "SRAM Cell Connection Structure;" which application is hereby incorporated herein by reference.

BACKGROUND

In deep micro technology, the sizes of contact plugs continue to shrink to fit the increasingly reduced gate pitches. To shrink the contact sizes without incurring impact on contact resistance, long contact plugs, as compared to square contact plugs, were adopted. By adopting long contact plugs, the widths of contact plugs, which widths are measured in gate-pitch direction, may be reduced. The long contact plugs have greater lengths, which are measured in gate-routing (gate lengthwise) direction. By using long contact plugs, both active contact sizes and lithography exposure areas are increased.

The long contact plugs can achieve both high gate density and low contact resistance. Concern, however, still exists. For example, line-end shortening and/or line-end to line-end bridging may occur at the ends of neighboring long contact plugs. These may result in either contact-to-fin active opening (also known as contact shortening) or contact-to-contact leakage (caused by contact bridging). To reduce the probability of the line-end shortening, a more limiting space rule is needed to increase the spacing between the ends of neighboring contact plugs, or a more aggressive Optical Proximity Correction (OPC) is needed at line ends. These solutions, however, impact the sizes of integrated circuits. The problem may become worse in future fin-type MOSFETs (3D MOSFETs) since 3D MOSFETs have very narrow active regions.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Static Random Access Memory (SRAM) cell is provided in accordance with various exemplary embodiments. The variations of the embodiments are discussed. Throughout the various views and illustrative embodiments, like reference numbers are used to designate like elements. Although six-transistor (6T) SRAM cells are used as examples to explain the concept of the embodiments, the embodiments is readily applicable to other SRAM cells having different number of transistors, such as 8T SRAM cells.

Figure 1:
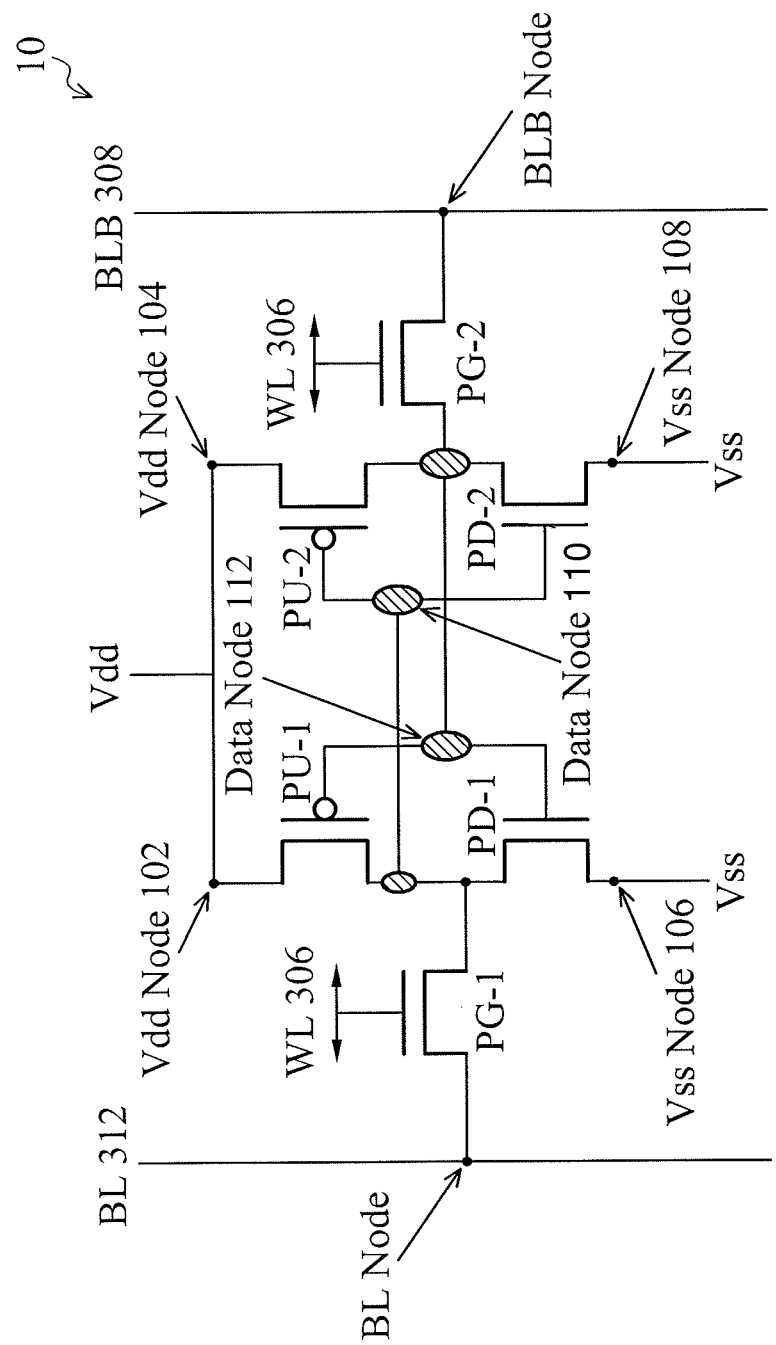
FIG. 1 is a circuit diagram of a Static Random Access Memory (SRAM) cell.

FIG. 1 illustrates a circuit diagram of SRAM cell 10 in accordance with some embodiments. SRAM cell 10 includes pass-gate transistors PG-1 and PG-2, pull-up transistors PU-1 and PU-2, which are P-type Metal-Oxide-Semiconductor (PMOS) transistors, and pull-down transistors PD-1 and PD-2, which are N-type Metal-Oxide-Semiconductor (NMOS) transistors. The gates of pass-gate transistors PG-1 and PG-2 are controlled by word-line WL that determines whether SRAM cell 10 is selected or not. A latch formed of pull-up transistors PU-1 and PU-2 and pull-down transistors PD-1 and PD-2 stores a bit, wherein the complementary values of the bit are stored in data node 110 and data node 112. The stored bit can be written into, or read from, SRAM cell 10 through bit lines BL 312 and BLB 308. SRAM cell 10 is powered through a positive power supply node VDD that has a positive power supply voltage (also denoted as VDD). SRAM cell 10 is also connected to power supply voltage VSS, which may be an electrical ground. Transistors PU-1 and PD-1 form a first inverter. Transistors PU-2 and PD-2 form a second inverter. The input of the first inverter is connected to transistor PG-1 and the output of the second inverter. The output of the first inverter is connected to transistor PG-2 and the input of the second inverter.

The sources of pull-up transistors PU-1 and PU-2 are connected to Vdd node 102 and Vdd node 104, respectively, which are further connected to power supply voltage (and line) Vdd. The sources pull-down transistors PD-1 and PD-2 are connected to Vss node 106 and Vss node 108, respectively, which are further connected to power supply voltage/line Vss. The gates of transistors PU-1 and PD-1 are connected to the drains of transistors PU-2 and PD-2, which connection node is referred to as data node 110. The gates of transistors PU-2 and PD-2 are connected to the drains of transistors PU-1 and PD-1, which connection node is referred to as data node 112. A source/drain region of pass-gate transistor PG-1 is connected to bit line BL 312 at a BL node. A source/drain region of pass-gate transistor PG-2 is connected to bit line BLB 308 at a BLB node.

Figure 2:
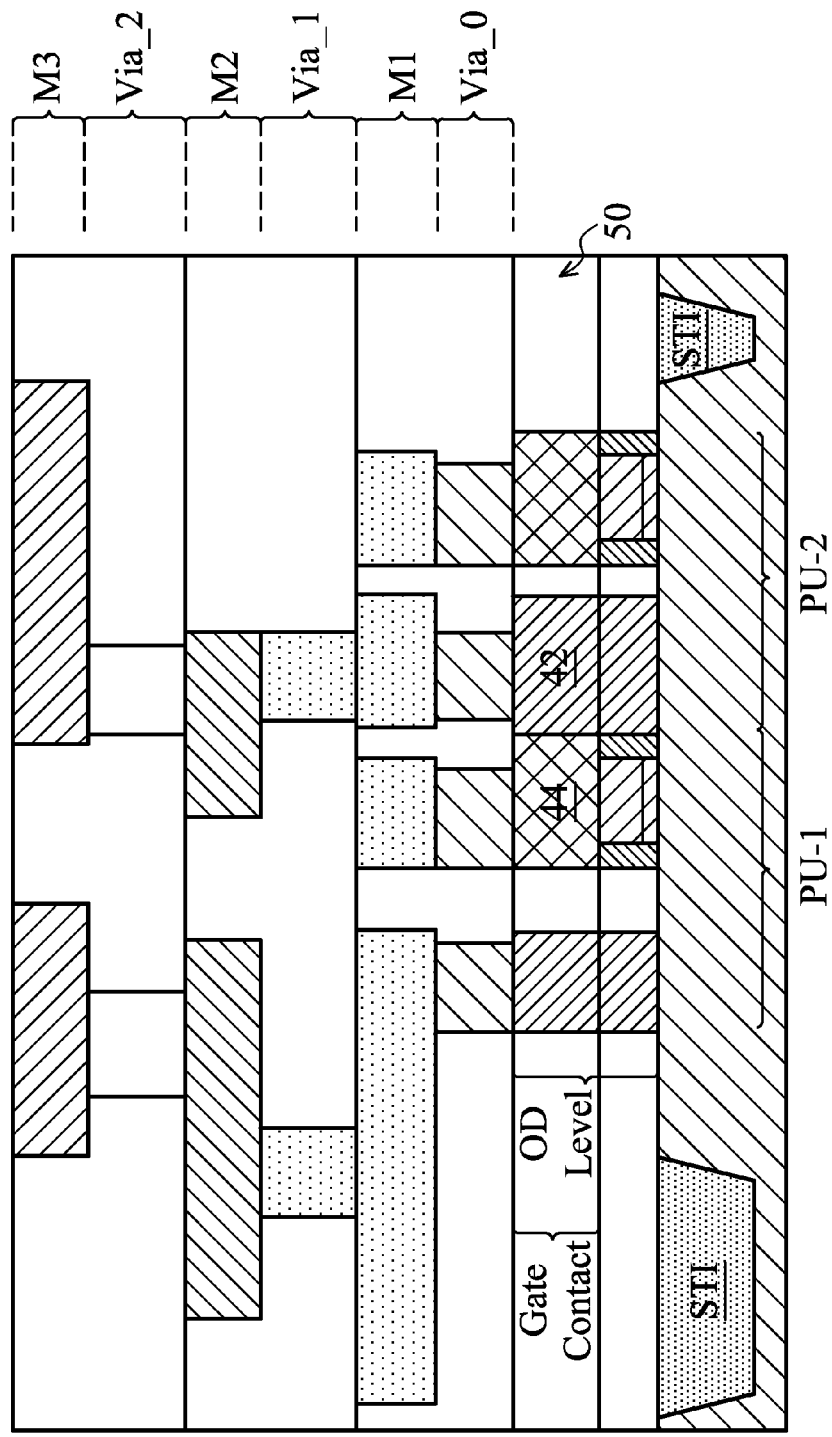
FIG. 2 illustrates a cross-sectional view illustrating layers of the SRAM cell.

FIG. 2 illustrates a schematic cross-sectional view of SRAM cell 10, which layers are formed on a semiconductor chip or wafer. It is noted that FIG. 2 is schematically illustrated to show various levels of interconnect structure and transistors, and may not reflect the actual cross-sectional view of SRAM cell 10. The interconnect structure includes a gate contact level, an OD (wherein the term "OD" represents "active region") level, via levels Via_0, Via_1, and Via_2, and metal layers M1, M2, and M3. Each of the levels includes one or more dielectric layers and the conductive features formed therein. The conductive features that are at the same level may have top surfaces substantially level to each other, bottom surfaces substantially level to each other, and may be formed simultaneously. The gate contact level connects gate electrodes of transistors (such as the illustrated exemplary transistors PU-1 and PU-2) to an overlying level such as the Via_0 level. The OD level connects source and drain regions of transistors, pickup regions of well regions, and the like to an overlying level such as the Via_0 level.

Figure 3:
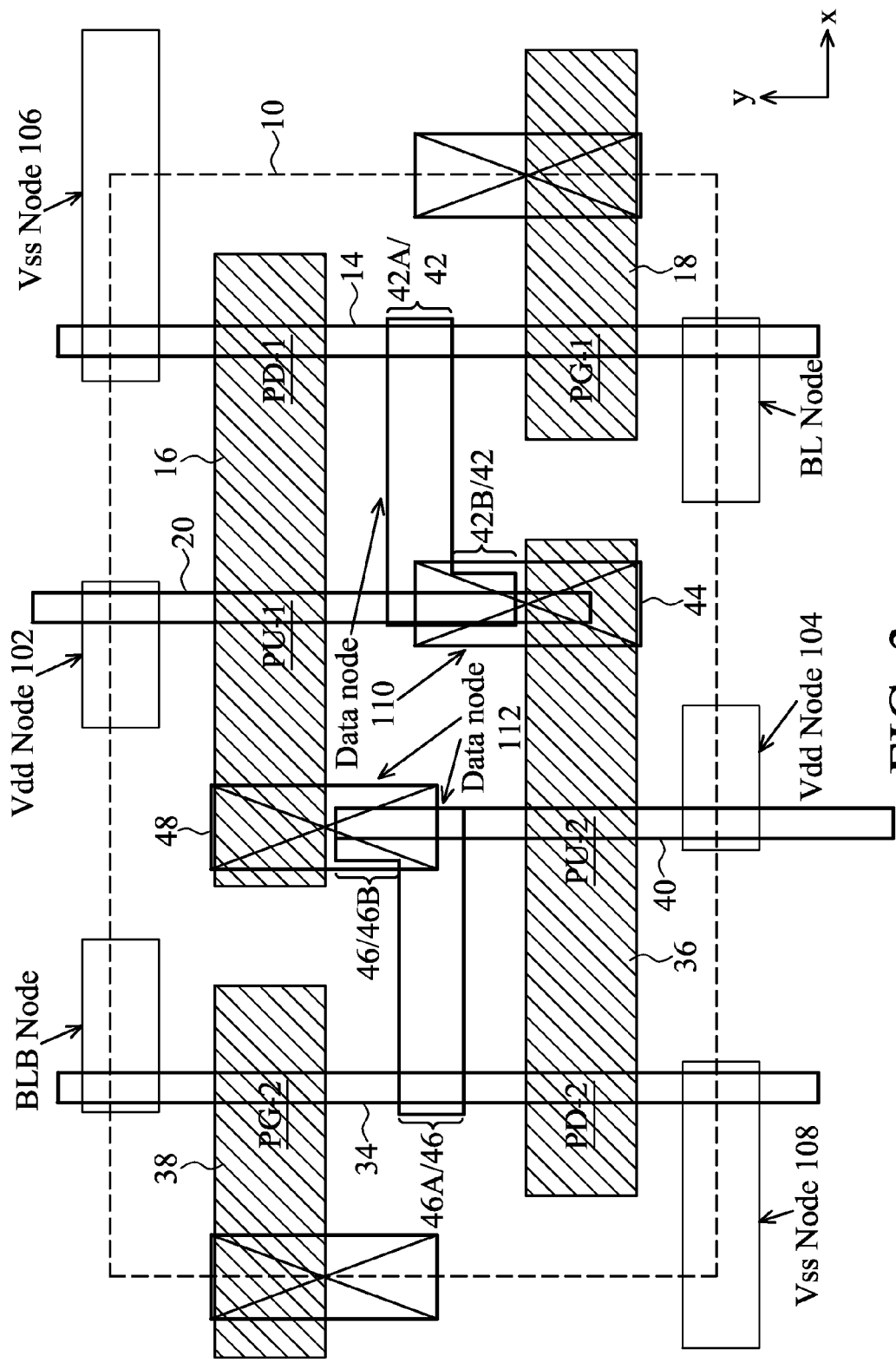
FIG. 3 illustrates a layout of the SRAM cell in accordance with embodiments.

FIG. 3 illustrates a layout of SRAM cell 10 in accordance with exemplary embodiments. In some embodiments, the layout has a Graphic Database System (GDS) format, and may be embodied on a tangible non-transitory storage medium such as a hard disk. The layout may be accessed and processed by a computer. Furthermore, the layouts as illustrated throughout the description may be formed on lithography masks that have transparent and opaque patterns, which lithography masks are used to exposed photo resists, so that features as illustrated throughout the description are formed to have the illustrated patterns (shapes). Accordingly, each of the layouts in the present disclosure may also represent a plurality of lithography masks incorporating the patterns shown in the respective layout.

The outer boundaries of SRAM cell 10 are illustrated using dashed lines, which forms a rectangle. Vdd node 102, Vdd node 104, Vss node 106, Vss node 108, the BL node, and the BLB node, which are shown in FIG. 1, are also illustrated in FIG. 3. Gate electrode 16 forms pull-up transistor PU-1 with the underlying active region (an n-well region) 20, which may be fin-based. Gate electrode 16 further forms pull-down transistor PD-1 with the underlying active region (a p-well region) 14, which may be fin-based. Gate electrode 18 forms pass-gate transistor PG-1 with the underlying active region 14. Gate electrode 36 forms pull-up transistor PU-2 with the underlying active region (an n-well region) 40. Gate electrode 36 further forms pull-down transistor PD-2 with the underlying active region (a p-well region) 34. Gate electrode 38 forms pass-gate transistor PG-2 with the underlying active region 34. Transistors PG-1 and PG-2, PU-1 and PU-2, and PD-1 and PD-2 may be Fin Field-Effect Transistors (FinFETs) in accordance with some embodiments.

As shown in FIG. 3, data node 110 includes OD level contact plug 42 and gate contact plug 44, which are features in the OD level and the gate contact level (FIG. 2), respectively. OD level contact plug 42 has an "L" shape with a first leg 42A having a longitudinal direction in the X direction, which is parallel to the extending directions of gate electrodes 16 and 36. OD level contact plug 42 further includes a second leg 42B extends in the Y direction (perpendicular to the X direction). Throughout the description, OD level contact plug 42 is also referred to as L-shaped contact plug. First leg 42A is formed over, and electrically interconnects active regions (drain regions) 14 and 20. The second leg 42B overlaps, and is electrically connected to, active region 20. Second leg 42B is also referred to as data node jog 42B hereinafter. In some embodiments, data node jog 42B extends toward gate electrode 36, and extends away from gate electrode 16. Gate contact plug 44 comprises a portion over, and is electrically connected to, gate electrode 36. In some embodiments, gate contact plug 44 has a longitudinal direction in the Y direction.

Figure 5:
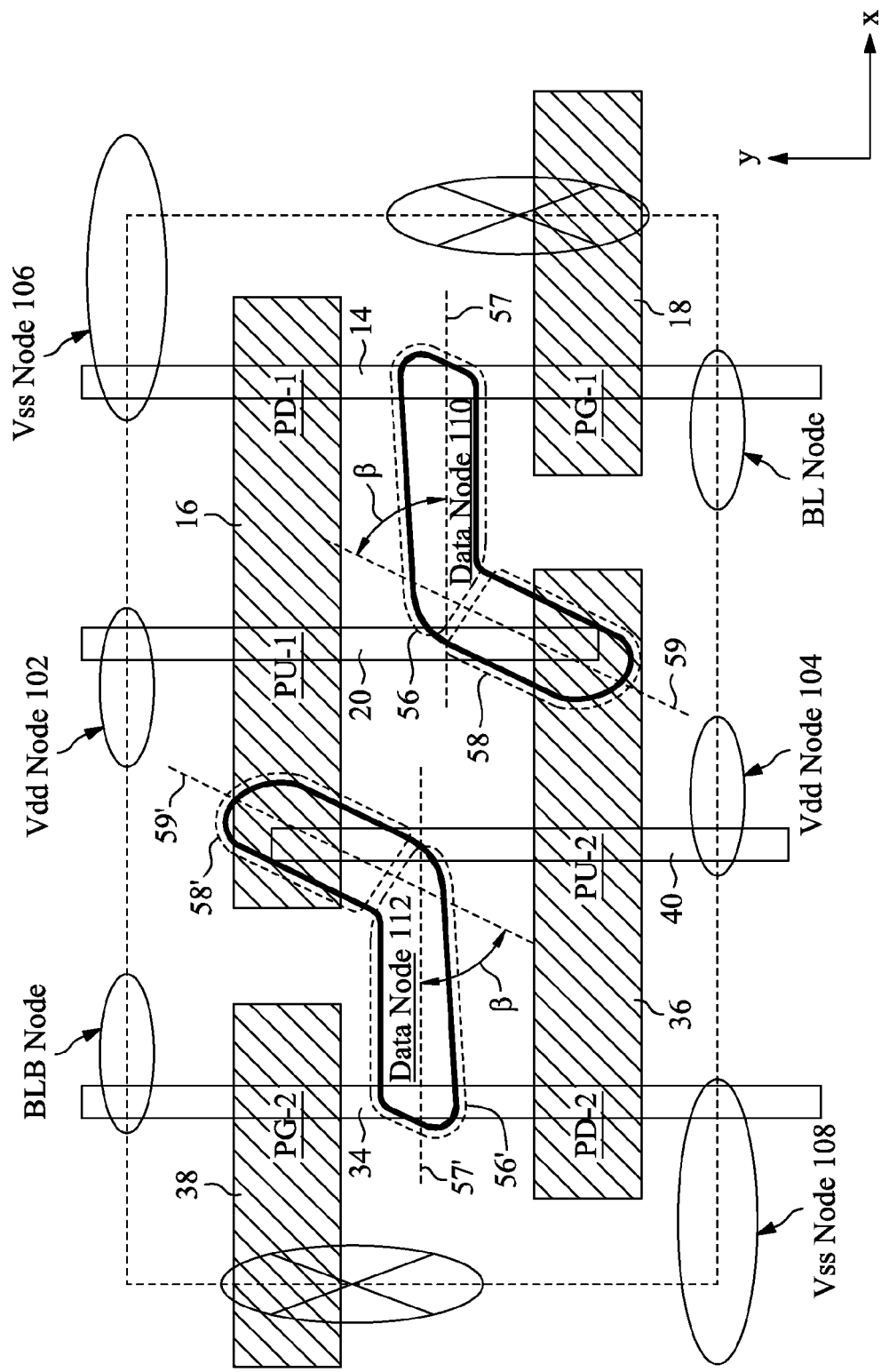
FIG. 5 illustrates a top view of the SRAM cell, wherein data nodes are formed by combining gate contact plugs and OD level contacts.

Furthermore, gate contact plug 44 overlaps leg 42B and possibly a portion of leg 42A. Accordingly, when the layout in FIG. 3 is implemented on a physical semiconductor chip to from a physical SRAM cell 10, gate contact plug 44 is merged with L-shaped contact plug 42 to form data node 110. Furthermore, as shown in FIG. 5 and will be discussed in subsequent paragraphs, gate contact plug 44 and L-shaped contact plug 42, when implemented on the semiconductor chip, are formed using a same metal-filling process, and form an integrated and continuous data node 110.

Data node 112 includes gate contact plug 48 and L-shaped contact plug 46, which have portions overlapped. Since data node 110 and data node 112 may be symmetric, the details of gate contact plug 48 and L-shaped contact plug 46 are not repeated herein, and may be found referring to the discussion of gate contact plug 44 and L-shaped contact plug 42, respectively. L-shaped contact plug 46 includes leg 46A having a lengthwise direction extending in the X direction, and data node jog 46B extending in the Y direction and toward gate electrode 16. Accordingly, jogs 42B and 46B may extend in opposite directions in accordance with exemplary embodiments. In some embodiments, the layout shape of contact plugs such as gate contact plugs 44 and 48 are drawn to have rectangular shapes. In alternative embodiments, the layout shape of contact plugs such as gate contact plugs 44 and 48 may have other elongated shapes, such as ellipses shapes.

In the embodiments, by forming data node jogs 42B and 46B, OD level contacts 42 and 46 no longer have line ends facing each other. Line ends are prone to various problems in integrated circuit manufacturing process. For example, the sizes and the shapes of the line ends are difficult to control. Especially, OD level contacts 42 and 46 are close to each other due to the small size of SRAM cell 10, and hence suffer from more severe line-end problems. By eliminating the line ends of OD level contacts 42 and 46 that face each other, the related line-end problems are eliminated. Due to the formation of jogs 42B and 46B, the line ends of OD level contacts 42 and 46 now face gate electrodes 36 and 16, respectively. Since L-shaped contact plugs 42 and 46 are intended to electrically connect to gate electrodes 36 and 16, respectively, the line-end problems of L-shaped contact plugs 42 and 46 will not affect the reliability of SRAM cell 10.

Figure 4:
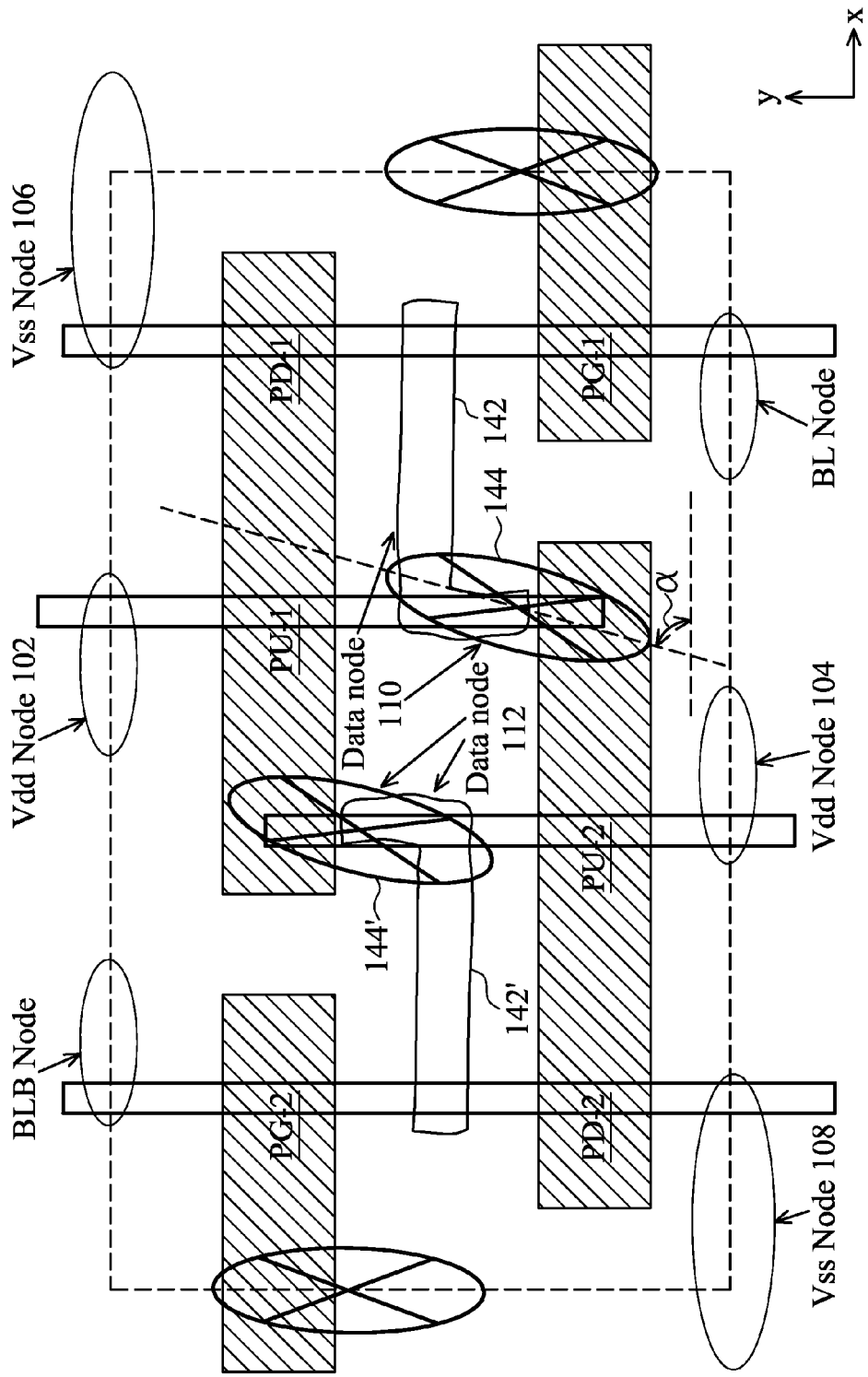
FIG. 4 illustrates shapes of openings in dielectric layers, in which gate contact plugs and OD level contacts are filled.

FIG. 4 illustrates the top views of openings in dielectric layers of SRAM cell 10 in accordance with embodiments, which the illustrated openings are formed for forming features 42, 44, 46, and 48 in FIG. 3. Unless specified otherwise, the details of the components in these embodiments are essentially the same as the like components, which are denoted by like reference numerals in FIG. 3. The details regarding the components in FIG. 4 may thus be found in the discussion of the embodiment shown in FIG. 3. In FIG. 4, to form gate contact plug 44 in FIG. 3, gate contact opening 144 is formed in dielectric layer 50 (FIG. 2). Gate contact opening 144 has a longitudinal direction un-parallel to the Y direction and the X direction. The longitudinal direction of gate contact opening 144 forms angle α with the X direction, wherein angle α is not equal to 90 degrees. Through process methods, angle α may be controlled in desirable ranges. In accordance with some embodiments, angle α is between about 60 degrees and 90 degrees. In some embodiments, gate contact opening 144 and gate contact opening 144', which is formed for filling gate contact plug 48 in FIG. 3 therein, have ellipses shapes.

When the layout in FIG. 3 is implemented on a physical semiconductor wafer or chip, data node 110 and data node 112 may have the top view shape as shown in FIG. 5, which illustrates a top view of various components in SRAM cell 100 on a physical semiconductor chip. FIG. 2 schematically illustrated a portion of data node 110, which includes gate contact plug 44 and OD level contact plug 42 merged with each other. In these embodiments, gate contact plug 44 and OD level contact plug 42 are formed in dielectric layer 50 (also referred to as Inter-Layer Dielectric (ILD) 50), and are formed by etching ILD 50 to form openings 142, 144, 142', and 144' in FIG. 4, and then filling openings 142, 144, 142', and 144'. The resulting conductive features filling openings 142 and 144 in FIG. 4 form data node 110 in FIG. 5, and the resulting conductive features filling openings 142' and 144' in FIG. 4 form data node 112 in FIG. 5. In some embodiments, the etching of ILD 50 for forming openings 142, 144, 142', and 144' is performed in separate etching steps, and use different lithography masks, with one lithography mask used for forming openings 142 and 142', and the other lithography mask used for forming openings 144 and 144'. The filling of openings 142 and 144, however, is performed in a same filling step, which is the same step for filling openings 142' and 144'. Therefore, referring back to FIG. 5, data node 110 is formed as an integrated and continuous feature, and data node 112 is formed as an integrated and continuous feature.

In FIG. 5, for clarity, some features illustrated in FIGS. 3 and 4 are not shown, although they are also manufactured for SRAM cell 10. Data node 110 includes first leg 56 having a longitudinal direction (axis) 57 substantially parallel to the X direction, and second leg 58 having a longitudinal direction (axis) 59 that is neither parallel to the X direction nor parallel to the Y direction. Axis 57 and 59 form angle β, which may be between about 45 degrees and about 80 degrees. Similarly, Data node 112 includes first leg 56' having a longitudinal direction (axis) 57' substantially parallel to the X direction, and second leg 58' having a longitudinal direction (axis) 59' that is neither parallel to the X direction nor parallel to the Y direction. Axis 57' and 59' form angle β', which may be between about 45 degrees and about 80 degrees.

FIGS. 6 through 9 illustrate the layouts (and the schematic top views) of SRAM cell 10 in accordance with alternative embodiments. SRAM cells 10 in FIGS. 6 through 9 may be in GDS formation and embodied on a tangible non-transitory storage medium such as a hard disk, and may be manufactured on semiconductor chips. Unless specified otherwise, the materials and formation methods of the components in these embodiments are essentially the same as the like components, which are denoted by like reference numerals in the embodiments shown in FIGS. 1 through 5. The details of the components shown in FIGS. 6 through 9 may thus be found in the discussion of the embodiment shown in FIGS. 1 through 5.

Figure 6:
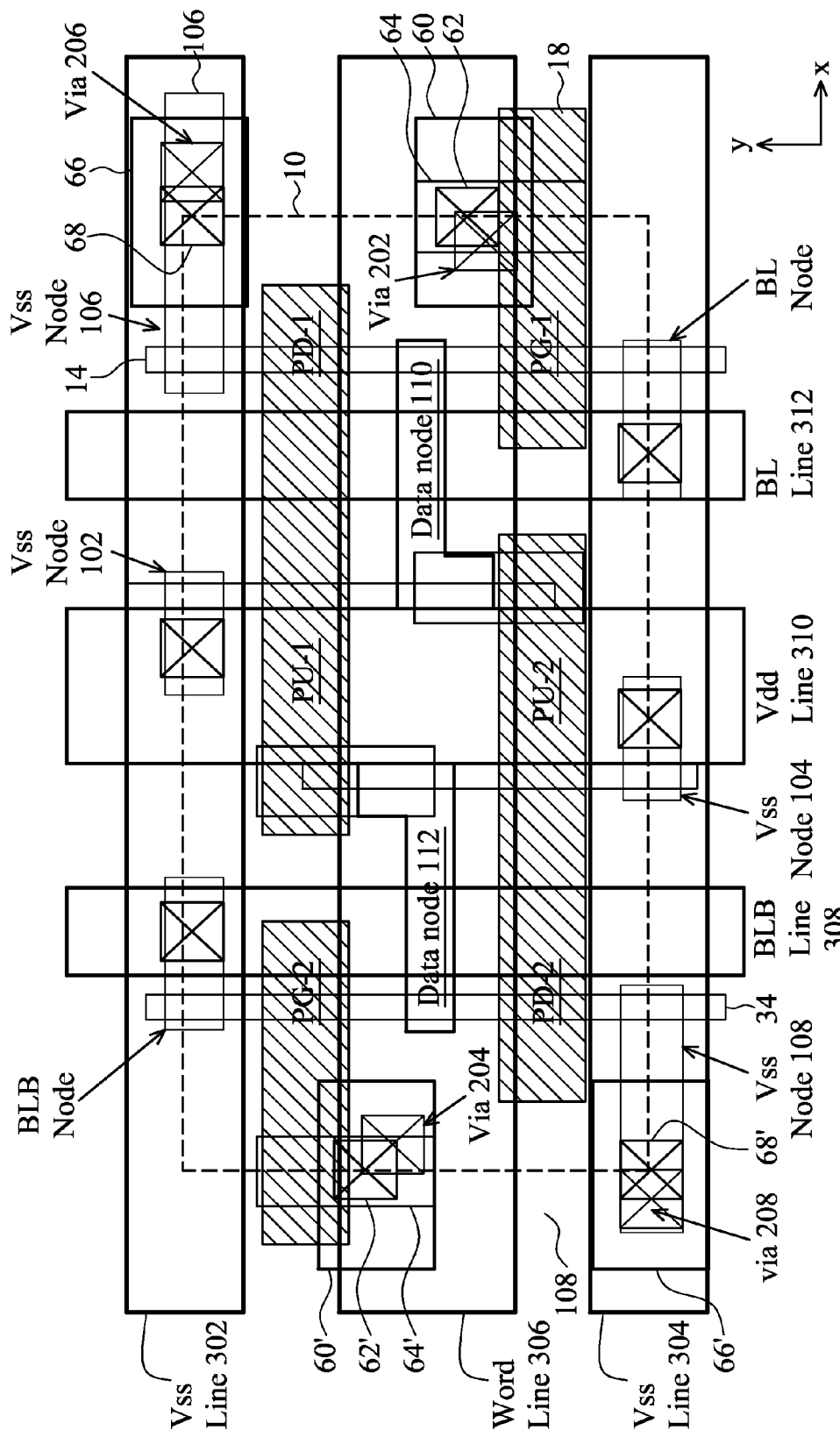
FIGS. 6 through 9 are layouts of SRAM cells in accordance with alternative embodiments.

Referring to FIG. 6, Vss line 302, Vss line 304, word line 306, BL line 312, BLB line 308, and Vdd line 310 are formed to pass through SRAM cell 10. Vss line 302 and Vss line 304 carry power supply voltage VSS, and Vdd line 310 carries power supply voltage Vdd. Vss lines 302 and 304 and word line 306 are parallel to the X direction, and may be in the M2 level (FIG. 2). BL line 312, BLB line 308, and Vdd line 310 are parallel to the Y direction, and may be in the M1 level (FIG. 2).

In an exemplary connection scheme, word line 306 is connected to underlying via 202, which is connected to the underlying metal pad 60 (in M1 level in FIG. 2), which is further connected to the underlying via 62 (in Via_0 level in FIG. 2). Via 62 is further connected to gate contact 64, which is connected to gate electrode 18 of pass-gate transistor PG-1. Vss line 302 is connected to underlying via 206, which is connected to the underlying metal pad 66 (in M1 level in FIG. 2), which is further connected to the underlying via 68 (in Via_0 level in FIG. 2). Via 68 is further connected to Vss node 106 (an OD level contact in FIG. 2), Vss node 106 is further connected to a portion of active region 14, which portion of active regions 14 acts as a source of pull-down transistor PD-1.

Similarly, word line 306 is connected to underlying via 204, which is connected to the underlying metal pad 60' (in M1 level in FIG. 2), which is further connected to the underlying via 62' (in Via_0 level in FIG. 2). Via 62' is further connected to gate contact 64', which is connected to gate electrode 36 of pass-gate transistor PG-2. Vss line 304 is connected to underlying via 208, which is connected to the underlying metal pad 66' (in M1 level in FIG. 2), which is further connected to the underlying via 68' (in Via_0 level in FIG. 2). Via 68' is further connected to Vss node 108 (an OD level contact in FIG. 2), Vss node 108 is further connected to a portion of active region 34, which portion of active regions 34 acts as a source of pull-down transistor PD-2.

Figure 7:
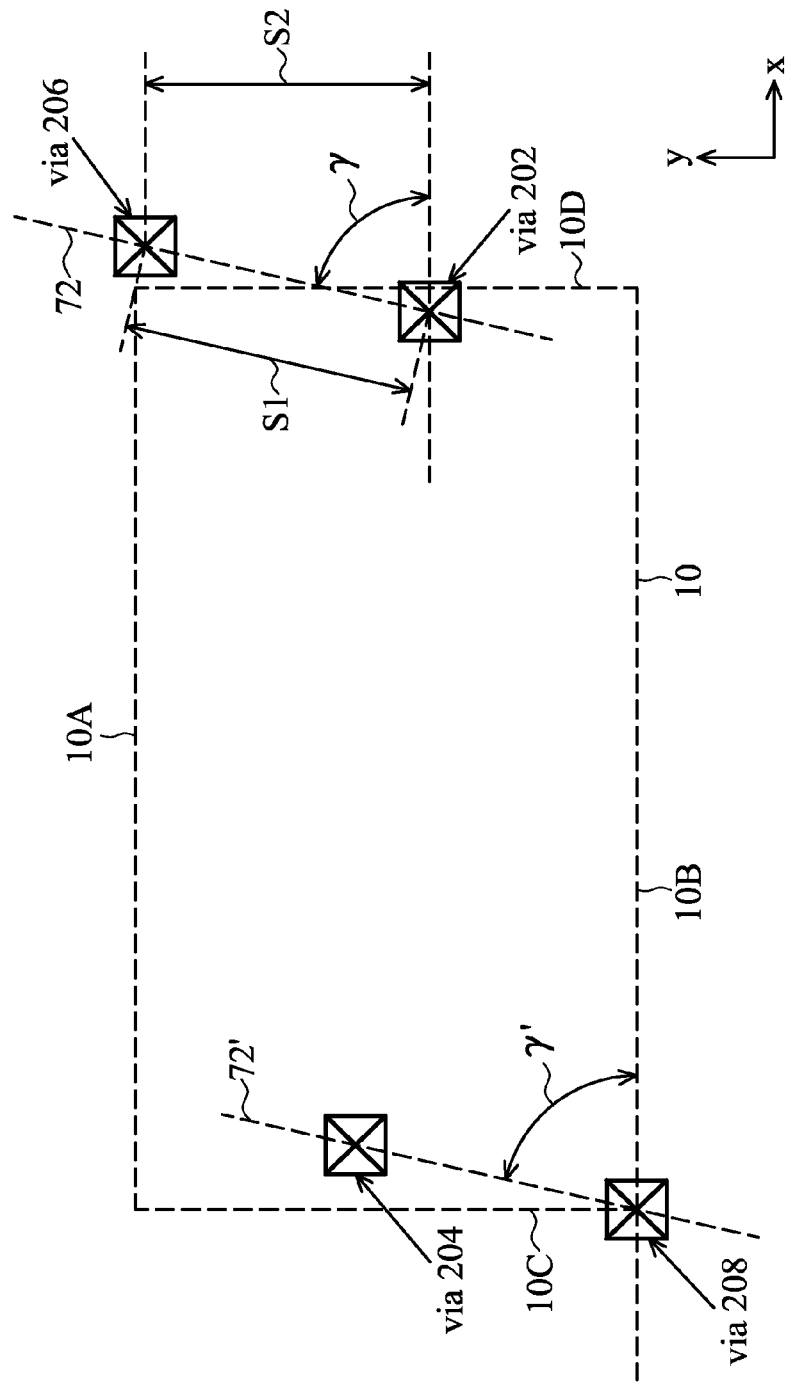

For clarity, via 202, via 204, via 206, and via 208 in FIG. 6 are reproduced in FIG. 7, and other components in FIG. 6 are not illustrated. FIG. 7 also illustrates the boundaries 10A, 10B, 10C, and 10D of SRAM cell 10, wherein boundaries 10A and 10B are parallel to each other, and boundaries 10C and 10D are parallel to each other, and are perpendicular to boundaries 10A and 10B. In some embodiments, the centers of via 202, via 204, via 206, and via 208 are not aligned to any of boundaries 10A, 10B, 10C, and 10D. For example, at least one, and possibly both, of vias 202 and 206 is not aligned to boundary 10D of SRAM cell 10. Furthermore, the center of via 206 does not overlap the joint of boundaries 10A and 10D, and the center of via 208 does not overlap the joint of boundaries 10B and 10C.

The centers of via 202 and via 206 have a connecting line 72, which forms angle γ with the X direction (such as the extending direction of boundaries 10A and 10B). Angle γ is neither equal to 0 degree nor equal to 90 degrees. In some embodiments, angle γ is between about 30 degrees and about 80 degrees. Making the centers of via 202, via 204, via 206, and via 208 misaligned from boundaries 10C and 10D of SRAM cell 10 may enlarge the distance between via 202 and via 206, and the distance between via 204 and 208. For example, assuming the distance between via 202 and via 206 is S1. If the centers of via 204 and 206 are aligned to boundary 10D, however, the distance between via 202 and via 206 is S2, which is smaller than S1. By enlarging the distance between via 202 and via 206, via 202 and via 206 may be formed using a same lithography mask, and do not have to be separated to two lithography masks using double patterning technology. The manufacturing cost is thus reduced.

Similarly, the centers of via 204 and via 208 have a connecting line 72', which forms angle γ' with the X direction. Angle γ' is neither equal to 0 degree nor equal to 90 degrees. In some embodiments, angle γ' is between about 30 degrees and about 80 degrees. Connecting lines 72 and 72' may be substantially parallel to each other.

Figure 8:
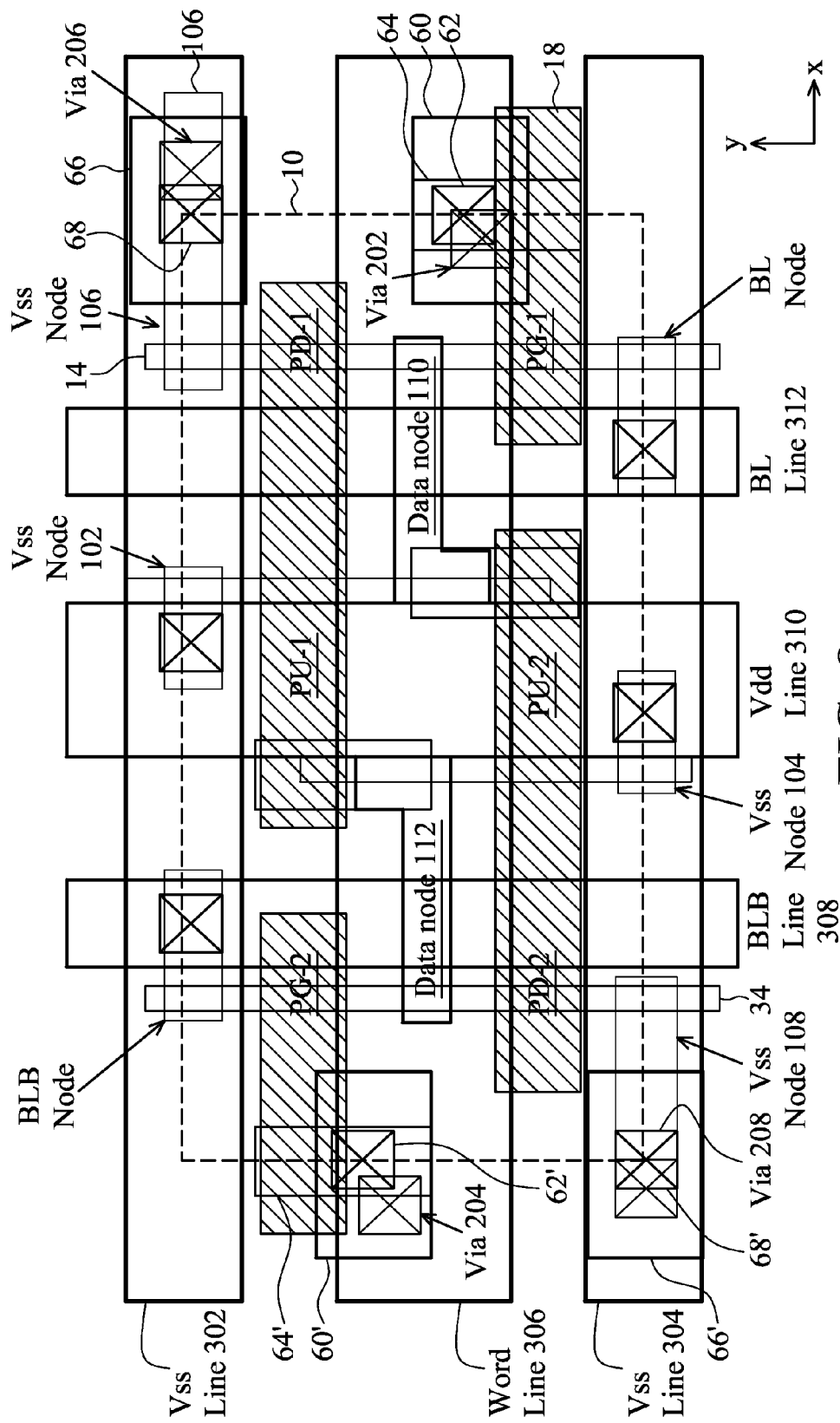
Figure 9:
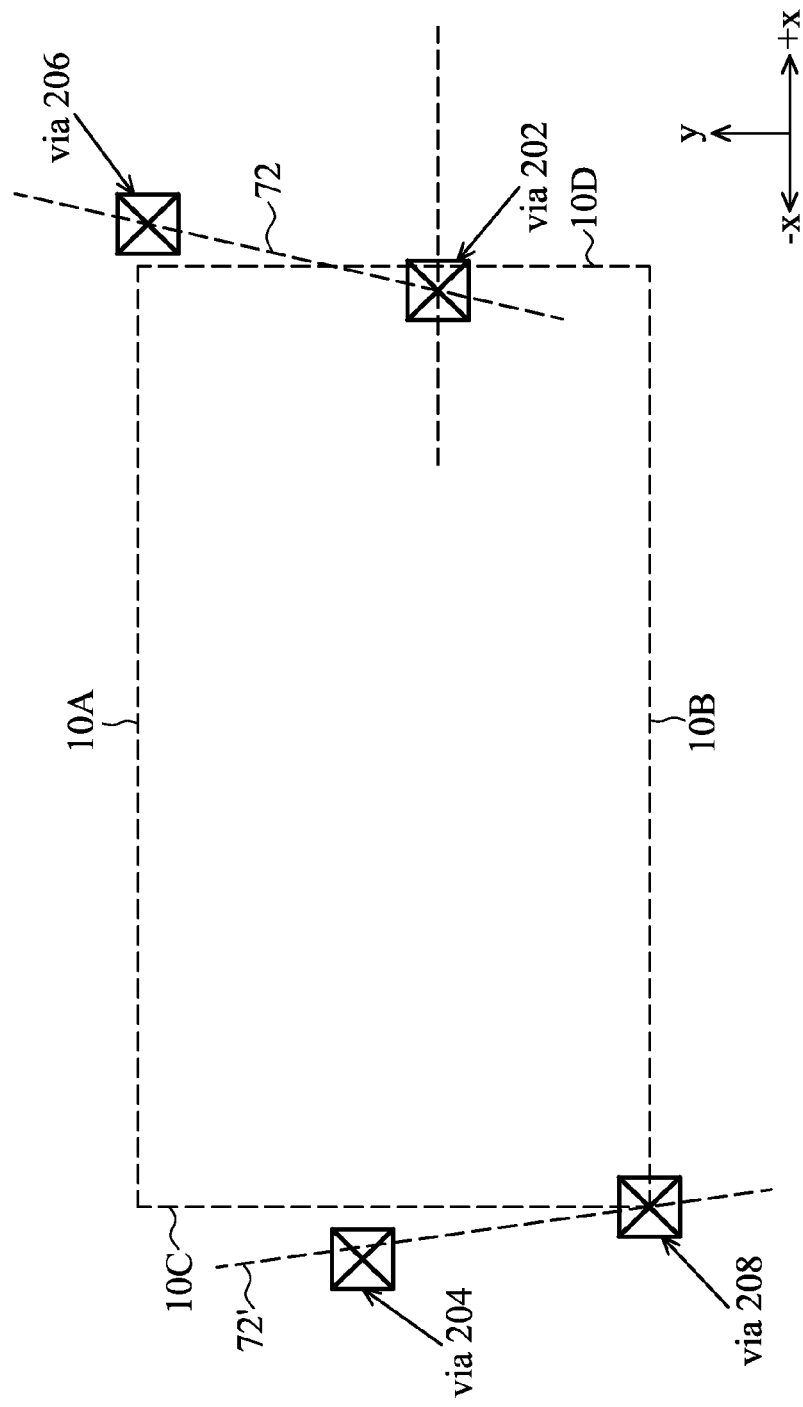

FIGS. 8 and 9 illustrate SRAM cell 10 in accordance with alternative embodiments. These embodiments are similar to the embodiments in FIGS. 6 and 7, except that connecting line 72' is substantially un-parallel to connecting line 72. In some embodiments, as shown in FIG. 9, via 202 and via 208 are on the inner sides of via 204 and via 208. Connecting lines 72 and 72' may tilt to opposite directions, for example, with connecting line 72 tilt to +X direction, and connecting line 72' tilt to −X direction.

In accordance with embodiments, an SRAM cell includes a first pull-up transistor and a second pull-up transistor, and a first pull-down transistor and a second pull-down transistor forming cross-latched inverters with the first pull-up transistor and the second pull-up transistor. A conductive feature includes a first leg having a first longitudinal direction, wherein the first leg interconnects a drain of the first pull-up transistor and a drain of the first pull-down transistor. The conductive feature further includes a second leg having a second extending direction. The first longitudinal direction and the second extending direction are un-perpendicular and un-parallel to each other. The second leg interconnects the drain of the first pull-up transistor and a gate of the second pull-up transistor.

In accordance with other embodiments, a device includes an SRAM cell. The SRAM cells includes a first cell boundary and a second cell boundary parallel to each other, a third cell boundary and a fourth cell boundary parallel to each other and perpendicular to the first cell boundary and the second cell boundary, a first pull-up transistor and a second pull-up transistor, a first pull-down transistor and a second pull-down transistor forming cross-latched inverters with the first pull-up transistor and the second pull-up transistor, a first pass-gate transistor connected to drains of the first pull-up transistor and the first pull-down transistor, and a second pass-gate transistor connected to drains of the second pull-up transistor and the second pull-down transistor. The device further includes a Vss line overlapping and parallel to the first cell boundary, and a first via underlying and contacting the Vss line, wherein the first via electrically couples the Vss line to a source of the first pull-down transistor. A word line is parallel to the Vss line. A second via is underlying and contacting the word line. The second via electrically couples the word line to a gate of the first pass-gate transistor. In a top view of the SRAM cell, a first connecting line connecting a first center of the first via and a second center of the second via is un-parallel and un-perpendicular to the first, the second, the third, and the fourth cell boundaries.

In accordance with yet other embodiments, an SRAM cell is embodied on a non-transitory computer-readable medium. The SRAM cell includes a first pull-up transistor and a second pull-up transistor, and a first pull-down transistor and a second pull-down transistor forming cross-latched inverters with the first pull-up transistor and the second pull-up transistor. A conductive feature pattern includes a first leg having a first longitudinal direction, wherein the first leg interconnects a drain of the first pull-up transistor and a drain of the first pull-down transistor, and a second leg having a second extending direction perpendicular to the first longitudinal direction. The second leg is connected to the first leg, and is located between the first leg and a first gate electrode of the second pull-up transistor and the second pull-down transistor. A gate contact plug includes a portion overlapping a portion of the second leg.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A Static Random Access Memory (SRAM) cell comprising:
    a first pull-up transistor comprising a portion of a first active region as a first drain and a portion of a first gate electrode strip as a first gate;
    a second pull-up transistor comprising a portion of a second active region as a second drain and a portion of a second gate electrode strip as a second gate, wherein the second gate electrode strip comprises:
        a first portion overlapping a first portion of the first active region; and
        a second portion and a third portion on opposite sides of the first portion;
    a first pull-down transistor and a second pull-down transistor forming cross-latched inverters with the first pull-up transistor and the second pull-up transistor; and
    a first conductive feature comprising:
        a first leg having a first longitudinal direction, wherein the first leg interconnects the drain of the first pull-up transistor and a drain of the first pull-down transistor; and
        a second leg having a second extending direction, wherein the first longitudinal direction and the second extending direction are un-perpendicular and un-parallel to each other, and wherein the second leg interconnects the first drain of the first pull-up transistor and the second gate of the second pull-up transistor, and the second leg overlaps both the first portion and the second portion of the second gate electrode strip.

2. The SRAM of claim 1, wherein the second leg comprises a gate contact plug overlapping the second gate of the second pull-up transistor, and wherein the first leg comprises an upper portion leveled with the second leg.

3. The SRAM of claim 1, wherein the first longitudinal direction and the second extending direction form an angle between about 45 degrees and about 80 degrees.

4. The SRAM of claim 1 further comprising:
    a second conductive feature comprising:
        a third leg having a third longitudinal direction, wherein the third leg interconnects the second drain of the second pull-up transistor and a drain of the second pull-down transistor; and
        a fourth leg having a fourth extending direction, wherein the third longitudinal direction and the fourth extending direction are un-perpendicular to each other, and wherein the fourth leg interconnects the second drain of the second pull-up transistor and the first gate of the first pull-up transistor.

5. The SRAM of claim 4, wherein the third longitudinal direction and the fourth extending direction form an angle between about 45 degrees and about 80 degrees.

6. The SRAM of claim 1 further comprising a pass-gate transistor, wherein the first leg of the first conductive feature is further connected to a source/drain region of the pass-gate transistor.

7. The SRAM of claim 1, wherein the first leg is between, and parallel to, longitudinal directions of the first gate electrode strip and the second gate electrode strip.

8. A Static Random Access Memory (SRAM) cell comprising:
    a first pull-up transistor and a first pull-down transistor connected in series between a positive power supply node and an electrical ground;
    a second pull-up transistor and a second pull-down transistor connected in series between the positive power supply node and an electrical ground; and
    a first conductive feature inter-coupling a drain of the first pull-up transistor, a drain of the first pull-down transistor, and a gate of the second pull-up transistor, wherein the first conductive feature has an L-shape comprising a first leg having a first longitudinal direction and a second leg having a second longitudinal direction, with the first longitudinal direction and the second longitudinal direction forming an angle greater than zero degrees and smaller than 90 degrees, wherein the second leg comprises a first end connected to the first leg and a second end opposite to the first end, and wherein the conductive feature terminates at the second end.

9. The SRAM of claim 8, wherein the first leg interconnects and overlaps the drain of the first pull-up transistor and the drain of the first pull-down transistor, and wherein the second leg interconnects and overlaps the drain of the first pull-up transistor and the gate of the second pull-up transistor.

10. The SRAM of claim 8, wherein the angle is between about 45 degrees and about 80 degrees.

11. The SRAM of claim 8, wherein the second leg comprises a gate contact plug overlapping the gate of the second pull-up transistor, and wherein the first leg comprises an upper portion leveled with the second leg.

12. The SRAM of claim 8 further comprising:
 a second conductive feature inter-coupling a drain of the second pull-up transistor, a drain of the second pull-down transistor, and a gate of the first pull-up transistor, wherein the second conductive feature has an additional L-shape comprising a third leg having a third longitudinal direction and a fourth leg having a fourth longitudinal direction, with the third longitudinal direction and the fourth longitudinal direction forming an additional angle greater than zero degree and smaller than 90 degrees.

13. The SRAM of claim 12, wherein the additional angle is between about 45 degrees and about 80 degrees.

14. The SRAM of claim 8 further comprising a pass-gate transistor, wherein the first leg of the first conductive feature is further connected to a source/drain region of the pass-gate transistor.

15. The SRAM of claim 8 further comprising:
 a first gate electrode shared by the first pull-up transistor and the first pull-down transistor; and
 a second gate electrode shared by the second pull-up transistor and the second pull-down transistor, wherein the first leg is between, and parallel to, longitudinal directions of the first gate electrode and the second gate electrode.

16. A Static Random Access Memory (SRAM) cell comprising:
 a first pull-up transistor and a second pull-up transistor;
 a first pull-down transistor and a second pull-down transistor forming cross-latched inverters with the first pull-up transistor and the second pull-up transistor, wherein the second pull-up transistor and the second pull-down transistor comprise a first gate electrode that further overlaps an active region of the first pull-up transistor, wherein the first gate electrode comprises a first portion and a second portion on opposite sides of the active region of the first pull-up transistor; and
 a conductive feature comprising:
  a first leg having a first longitudinal direction, wherein the first leg interconnects a drain of the first pull-up transistor and a drain of the first pull-down transistor; and
  a second leg having a second extending direction un-parallel to the first longitudinal direction, wherein the second leg is connected to the first leg, and is located between the first leg and the first gate electrode, wherein the second leg comprises a first end connected to the first leg and a second end opposite to the first end, and wherein the conductive feature terminates at the second end, and the second leg overlaps both the first portion and the second portion of the first gate electrode.

17. The SRAM of claim 16, wherein the first leg and the second leg are further un-perpendicular to each other.

18. The SRAM of claim 8, wherein the conductive feature electrically interconnects the drain of the first pull-up transistor, the drain of the first pull-down transistor, and the gate of the second pull-up transistor.

\* \* \* \* \*